United States Patent

Ohshima

[11] Patent Number: 5,990,544
[45] Date of Patent: Nov. 23, 1999

[54] LEAD FRAME AND A SEMICONDUCTOR DEVICE HAVING THE SAME

[75] Inventor: Masae Ohshima, Tateyama, Japan

[73] Assignee: Nippon Steel Semiconductor Corp., Chiba, Japan

[21] Appl. No.: 09/110,261

[22] Filed: Jul. 6, 1998

[30] Foreign Application Priority Data

Jul. 7, 1997 [JP] Japan .................................. 9-195239

[51] Int. Cl.⁶ ............................................. H01L 23/495
[52] U.S. Cl. .......................................... 257/676; 257/666
[58] Field of Search .................................... 257/666, 670, 257/669, 674, 676

[56] References Cited

U.S. PATENT DOCUMENTS

| | | | |
|---|---|---|---|
| 5,162,895 | 11/1992 | Takahashi et al. | 257/670 |
| 5,283,466 | 2/1994 | Hayashi | 257/670 |
| 5,796,162 | 8/1998 | Huang | 257/676 |

FOREIGN PATENT DOCUMENTS 6-224356 of 1994 Japan .
8-78590 of 1996 Japan .

*Primary Examiner*—Sheila V. Clark
*Attorney, Agent, or Firm*—Pollock, Vande, Sande & Priddy, Amernick

[57] ABSTRACT

A lead frame includes a base, a substantially rectangular device hole formed in the base, an island formed in the device hole and offset a predetermined distance from the base, a plurality of inner leads arranged at predetermined intervals to extend toward a pair of opposing edges of the island, and suspension pins formed to extend toward a pair of edges of the island not opposing the end portions of the inner leads. The island is used to mount a semiconductor chip, and the suspension pins connect the island and the base. A pair of dummy leads extended from the base toward the island is formed on the both sides of at least one suspension pin. The distance from the side edge of the suspension pin to the side edge of the dummy lead is equal to or smaller than the distance from the end portions of the inner leads to the side edge of the island. This prevents the island of the upper lead frame from being clamped between the lower surfaces of the inner leads and the chip mounting surface of the island of the lower lead frame.

17 Claims, 9 Drawing Sheets

LEAD FRAME AND A SEMICONDUCTOR DEVICE HAVING THE SAME

BACKGROUND OF THE INVENTION

1. Field of the Invention

The present invention relates to a lead frame and a semiconductor device in which a semiconductor chip is mounted on the lead frame and, more particularly, to techniques suitably applicable to a semiconductor device lead frame used to mount a resin-encapsulated semiconductor device and a semiconductor device using the lead frame.

2. Description of the Related Art

Generally, a semiconductor device in which a semiconductor chip is die-bonded to an island of a lead frame uses a lead frame processed so that the upper surface of the island is lower by a predetermined thickness than the upper surfaces of the inner leads. The lead frame is thus processed principally to prevent a bonding wire connecting the upper surface of an electrode formed on a semiconductor chip and the upper surface of an inner lead of the lead frame from contacting the edge of the semiconductor chip. It is preferable to decrease any level difference in the direction of thickness of the semiconductor chip between the electrode upper surface and the inner lead upper surface.

For example, FIG. 7A is a plan view showing a lead frame used in a so-called SOP (Small Outline L-Leaded Package) semiconductor device in which outer leads extend in two directions from the package main body. FIG. 7B is a sectional view taken along a line VI–VI' of FIG. 7A. Note that a plurality of such lead frames are continuously formed in a single frame so that a plurality of semiconductor chips can be mounted. FIG. 7A shows one of these lead frames corresponding to one semiconductor chip.

As shown in FIG. 7A, a nearly rectangular device hole 21 is formed in a central portion of the lead frame. In this device hole 21, a flat, essentially rectangular island 22, inner leads 23, outer leads 24, tiebars 25, and a pair of suspension pins 27 are formed. The inner leads 23 are aligned at predetermined pitches to extend toward a pair of opposing edges of the island 22. The outer leads 24 are connected in a one-to-one correspondence with the inner leads 23. Each tiebar 25 is formed to cross the boundary between the inner leads 23 and the outer leads 24. The suspension pins 27 connect those two edges of the island 22, which do not oppose the end portions of the inner leads 23, and a base 26. The lead frame usually has a thickness T1 of about 0.2 mm.

A bent portion 29 is formed in a predetermined portion of each suspension pin 27. Consequently, as shown in FIG. 7B, the island 22 is offset a distance Td from the base 26. This offset Td is usually set to an amount corresponding to the thickness of the semiconductor chip used. The offset Td is generally around 0.3 to 0.5 mm although it also depends upon the type of product.

FIG. 8 is a flow chart showing a process of mounting a semiconductor chip on the island 22 of the lead frame. First, several tens of lead frames to about a hundred lead frames are stacked to improve the working efficiency (step S21). The stacked lead frames are supplied to an automatic semiconductor chip mounter (step S22). In the mounter, a suction pad is lowered toward the lead frames, and the upper surface of the base 26 of the topmost lead frame is chucked by the suction pad (step S23). The suction pad is raised to separate the topmost lead frame (step S24). The upper surface of the island 22 of the separated lead frame is coated with an adhesive such as silver paste (step S25). A semiconductor chip is placed on the surface of the island 22 coated with the silver paste, and the island 22 and the chip are adhered (step S26). Through these steps the semiconductor chip is mounted on the island 22 of the lead frame.

Between steps S21 and S24 of the above process, vibrations sometimes act on the stacked lead frames which then become displaced from each other. If this is the case, in a direction parallel to the direction in which the suspension pins extend, the bent portion of the suspension pin functions as a stopper to prevent displacement in this direction. However, nothing functions as a stopper in a direction perpendicular to the extending direction of the suspension pins, i.e., in a direction parallel to the direction in which the inner leads extend. Consequently, as shown in a sectional view of FIG. 9, the island 22 of the upper one of two stacked lead frames sometimes enters between an inner lead 33 and an island 32 of the lower lead frame. If the upper lead frame is pulled up by the suction pad in this state in step S24, the inner leads 33 of the lower lead frame may deform, or the lead frame may drop from the suction pad during the pulling makeing it impossible to separate the lead frames from each other.

SUMMARY OF THE INVENTION

It is an object of the present invention to provide a lead frame which permits a plurality of stacked lead frames to be reliably separated from each other without deforming or damaging inner leads and the like, and a semiconductor device using this lead frame.

It is another object of the present invention to provide a lead frame having a structure with which an island of the upper one of two given stacked lead frames of a plurality of lead frames is not clamped between inner leads and an island of the lower lead frame, and a semiconductor device using this lead frame.

It is still another object of the present invention to improve the yield of a semiconductor device by using a lead frame which allows a plurality of stacked lead frames to be reliably separated from each other without deforming or damaging inner leads and the like.

A lead frame of the present invention is a lead frame including a base, a substantially rectangular device hole formed in the base, and an island for mounting a semiconductor chip inside the device hole. The island is offset a predetermined distance in a direction of thickness from the base, a plurality of inner leads are arranged at predetermined intervals to extend toward the island, and suspension pins are provided for connecting the island and the base.

In this lead frame, dummy leads extending from the base toward the island are formed on both sides of at least one suspension pin. The distance from a side edge of the suspension pin to a side edge of the dummy lead is equal to or smaller than the distance from the end portions of the inner leads to a side edge of the island.

A bent portion is formed in a predetermined position of the suspension pin to divide the suspension pin into a first portion formed on that side of the bent portion which is closer to the island in substantially the same plane as a surface of the island, and a second portion formed on that side of the bent portion which is closer to the base in substantially the same plane as the base. The end portion of the dummy lead protrudes toward the island farther than the boundary between the bent portion and the second portion.

In other words, a bent portion is formed in a predetermined position of the suspension pin to divide the suspension pin into a first portion formed on that side of the bent portion which is closer to the island in substantially the same plane as a surface of the island, and a second portion formed on that side of the bent portion which is closer to the base in substantially the same plane as the base. The length of the dummy lead is longer than the length of the second portion of the suspension pin located adjacent to the dummy lead.

Accordingly, even when stacked lead frames are displaced from each other in the direction in which the inner leads extend, the bent portion of the suspension pin of the upper lead frame comes in contact with the dummy lead of the lower lead frame to prevent further displacement. This prevents the island of the upper lead frame from being clamped between the inner leads and the island of the lower lead frame.

Another aspect of the lead frame of the present invention is a lead frame including a base, a substantially rectangular device hole formed in the base, and an island for mounting a semiconductor chip inside the device hole. The island is offset from the base by an amount smaller than a thickness of the island in a direction of thickness of the base, a plurality of inner leads are arranged at predetermined intervals to extend toward the island, and suspension pins are provided for connecting the island and the base.

Accordingly, even when stacked lead frames are displaced from each other in the direction in which the inner leads extend, the side edge of the island of the upper lead frame comes in contact with the end portions of the inner leads of the lower lead frame to prevent further displacement. This prevents the island of the upper lead frame from being clamped between the inner leads and the island of the lower lead frame.

A semiconductor device of the present invention comprises an island for mounting a semiconductor chip, a plurality of inner leads arranged at predetermined intervals to extend toward the island, and suspension pins extending from a side edge of the island in a direction perpendicular to a direction of thickness of the island.

In this semiconductor device, dummy leads extending toward the island are formed on both sides of at least one suspension pin. The distance from a side edge of the suspension pin to a side edge of the dummy lead is equal to or smaller than the distance from the end portions of the inner leads to a side edge of the island.

A bent portion is formed in a predetermined position of the suspension pin to divide the suspension pin into a first portion formed on that side of the bent portion which is closer to the island in substantially the same plane as a surface of the island, and a second portion formed on that side of the bent portion which is closer to the base in substantially the same plane as the base. The end portion of the dummy lead protrudes toward the island farther than the boundary between the bent portion and the second portion.

It is preferable that chip electrodes formed on one surface of the semiconductor chip be connected to predetermined positions of the inner leads by bonding wires, and the dummy leads are left unconnected to the chip electrodes.

Accordingly, even when stacked lead frames are displaced from each other in the direction in which the inner leads extend, the bent portion of the suspension pin of the upper lead frame comes in contact with the dummy lead of the lower lead frame to prevent further displacement. This prevents the island of the upper lead frame from being clamped between the inner leads and the island of the lower lead frame. Therefore, the lead frames are prevented from deforming or being damaged during the process of fabricating the semiconductor device. This improves the yield of the semiconductor device.

In the present invention, dummy leads are formed at a predetermined distance on both sides of the suspension pin. This distance is made shorter than the distance from the side edge of the island to the end portions of inner leads. Alternatively, the offset of the island from the base is made smaller than the thickness of the island. That is, even when stacked lead frames are displaced from each other, the dummy leads or the end portions of the inner leads of the lower one of the stacked lead frames function as a stopper to prevent further displacement. This prevents the island of the upper lead frame from being clamped between the lower surfaces of the inner leads and the chip mounting surface of the island of the lower lead frame. Therefore, the upper lead frame can be pulled up and separated from the lower lead frame without deforming or damaging the inner leads and the like.

Additionally, the use of such lead frames can improve the yield of completed semiconductor devices.

DETAILED DESCRIPTION OF THE PREFERRED EMBODIMENTS

Several embodiments of a lead frame according to the present invention will be described in detail below with reference to the accompanying drawings.

First Embodiment

Figure 1A:
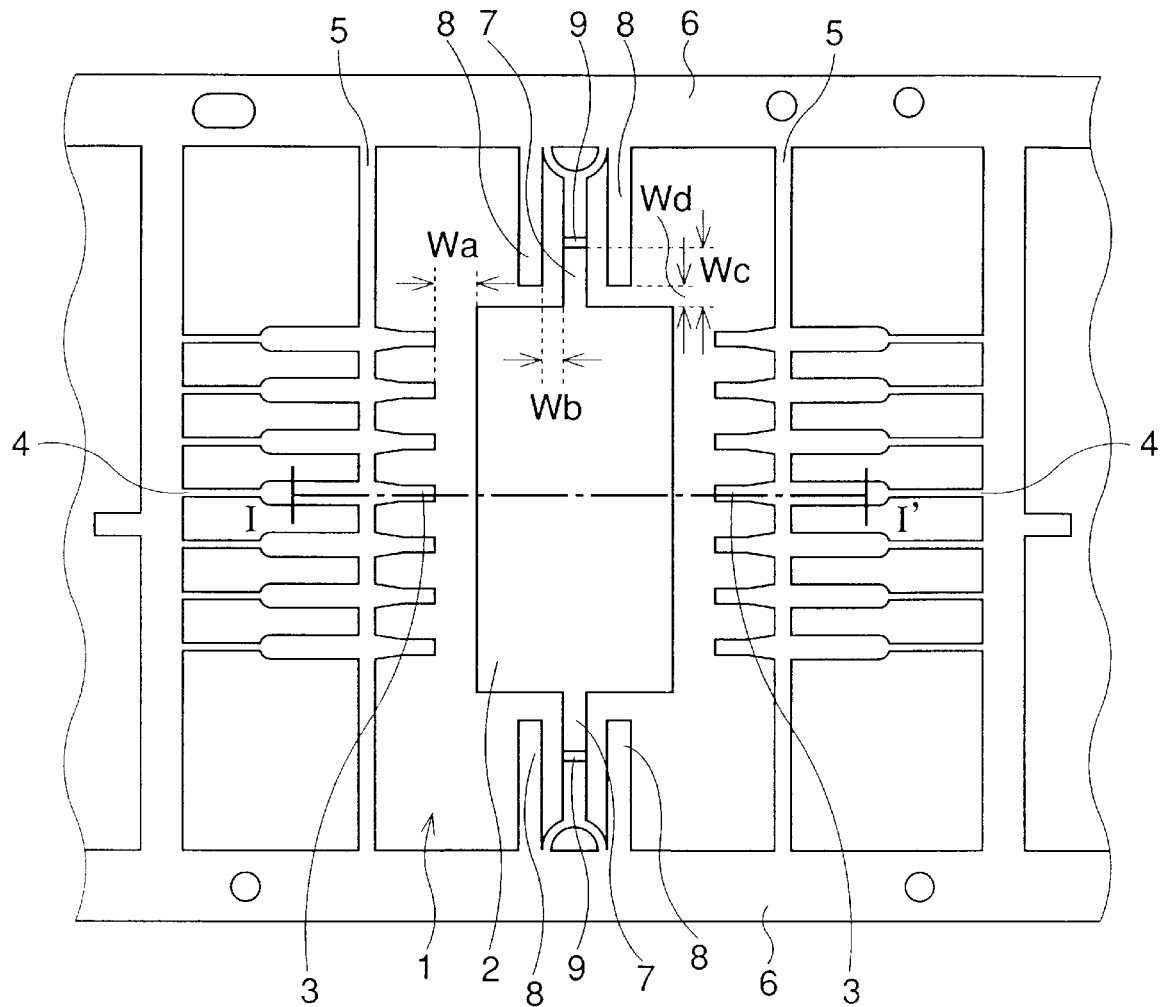
FIG. 1A is a schematic plan view showing a lead frame of the present invention.
Figure 1B:
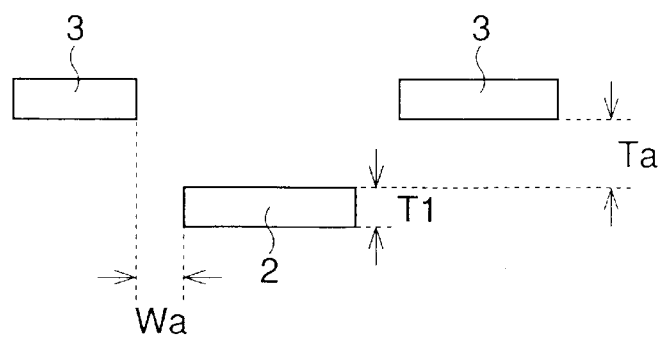
FIG. 1B is a schematic sectional view taken along a line I–I' in the lead frame shown in FIG. 1A.
Figure 2A:
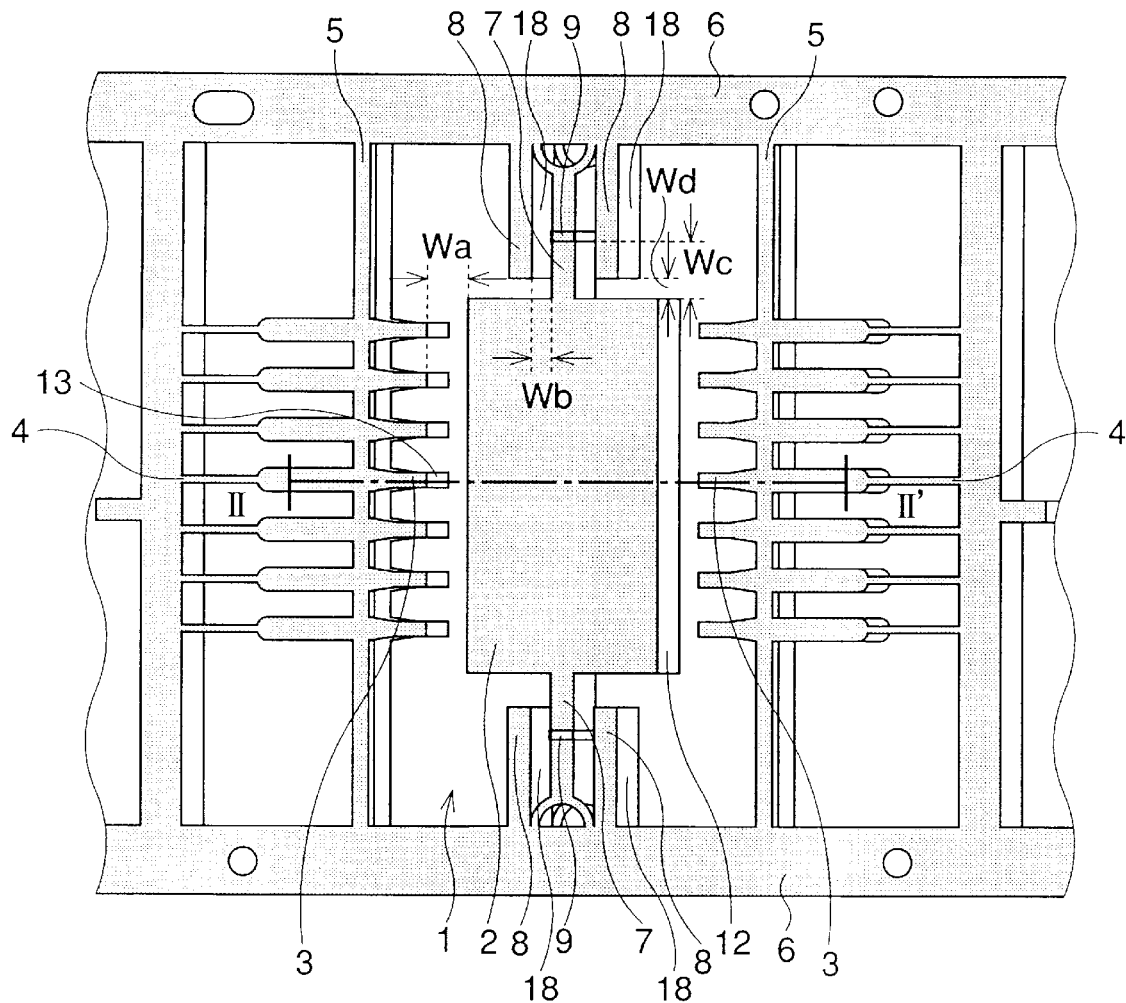
FIG. 2A is a schematic plan view showing the state wherein two lead frames of the present invention are stacked.
Figure 2B:
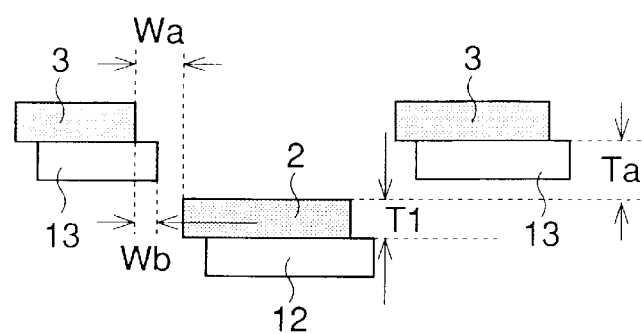
FIG. 2B is a schematic sectional view taken along a line II–II' of the lead frames shown in FIG. 2A.

The first embodiment will be described below. An outline of the arrangement of this lead frame will be described first. FIG. 1A is a schematic plan view showing the lead frame. FIG. 1B is a sectionalview taken along aline I–I' in FIG. 1A. FIG. 2A is a schematic plan view showing the state wherein two stacked lead frames shown in FIG. 1A are maximally displaced from each other in a direction parallel to a direction in which the inner leads extend toward an island. FIG. 2B is a sectional view taken along a line II–II' in FIG. 2A.

A nearly rectangular device hole 1 is formed in a central portion of the lead frame of the first embodiment shown in FIG. 1A. In this device hole 1, a flat, essentially rectangular island 2, inner leads 3, outer leads 4, tiebars 5, a pair of suspension pins 7, and dummy leads 8 are formed. The inner leads 3 align at predetermined pitches toward a pair of opposing edges of the island 2. The outer leads 4 are connected in a one-to-one correspondence with the inner leads 3. Each tiebar 5 is formed to cross the boundary between the inner leads 3 and the outer leads 4. The suspension pins 7 connect those two edges of the island 2, which do not oppose the end portions of the inner leads 3, and a base 6. The dummy leads 8, extending from the base 6 toward the island 2, are formed on the both sides of each suspension pin 7.

Note that a plurality of such lead frames are continuously formed so that a plurality of semiconductor chips can be mounted. FIG. 1A shows one of these lead frames corresponding to one semiconductor chip. Note also that the lead frame usually has a thickness T1 of about 0.2 mm, although it also depends upon the type of product.

As shown in FIG. 1B, the island 2 is offset a predetermined distance Ta from the base 6 by a bent portion 9 formed in each suspension pin 7. This offset Ta is usually set to an amount corresponding to the thickness of a semiconductor chip. The offset Ta is generally about 0.3 to 0.5 mm, although it also depends upon the type of product. The bent portion 9 has a predetermined tapered angle in the direction of thickness of the island 2.

As shown in FIG. 1A, a distance Wb between the side edge of the suspension pin 7 and the side edge of the dummy lead 8 formed adjacent to the suspension pin 7 is made smaller than a minimum distance Wa between the end portions of the inner leads 8 and the side edge of the island 2. Also, a distance Wc between the end portion of the dummy lead 8 and the side edge of the island 2 is made smaller than a distance Wd between the bent portion 9 of the suspension pin 7 and the side edge of the island 2.

Figure 8:
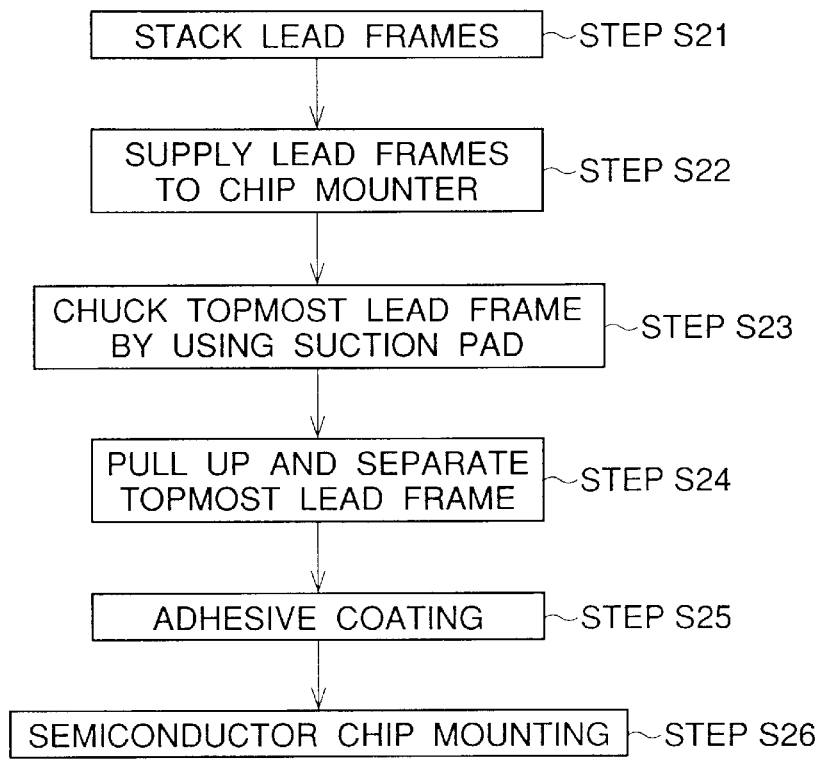
FIG. 8 is a flow chart showing a process of mounting a semiconductor chip on the conventional lead frame in order of the steps.
Figure 9:
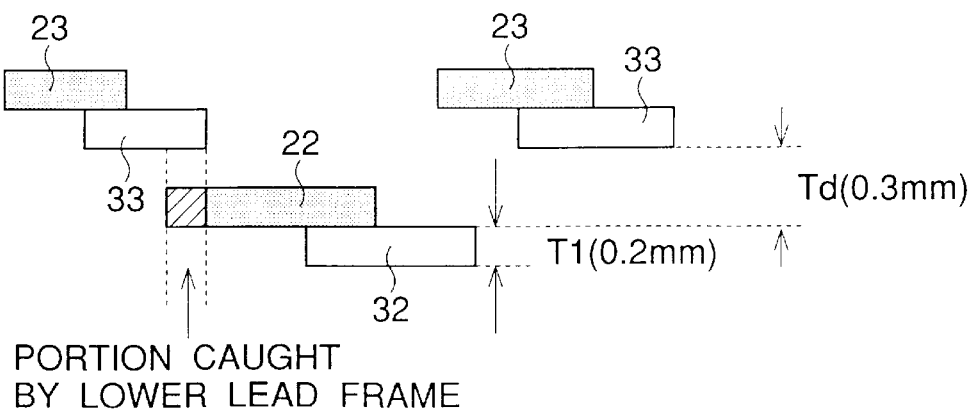
FIG. 9 is a schematic sectional view showing the state wherein two conventional lead frames are stacked.

A description of the process until a semiconductor chip is mounted on the island 2 of the lead frame of this embodiment is omitted because the process is similar to the conventional method using an automatic semiconductor chip mounter as shown in FIG. 8. In this embodiment, however, even if vibrations or the like act on a plurality of stacked lead frames between steps S21 and S24 of FIG. 8 and two given stacked lead frames are displaced from each other in a direction parallel to the direction in which the inner leads 3 extend toward the island 2, as shown in FIG. 2A, the bent portion 9 of the suspension pin 7 of the upper lead frame comes in contact with a dummy lead 18 of the lower lead frame to prevent further displacement. That is, the displacement between two stacked lead frames is always decreased to the distance Wb or less.

That is, the minimum distance Wa between the end portions of the inner leads 3 and the side edge of the island 2 is made larger than the distance Wb. Therefore, as shown in FIGS. 2A and 2B, the side edge of the island 2 of the upper lead frame protrudes toward outer leads 14 farther than the end portions of inner leads 13 of the lower lead frame. This prevents the island 2 of the upper lead frame from being clamped between the inner leads 13 and the island 12 of the lower lead frame.

In the first embodiment as described above, in a lead frame for mounting a semiconductor chip, dummy leads extending parallel to side edges of the suspension pin are formed on the both sides of a suspension pin. Also, the end portions of these dummy leads protrude toward an island farther than a bent portion formed in the suspension pin. The distance Wb from the side edge of the suspension pin to the side edge of the adjacent dummy lead is made smaller than the minimum distance Wa from the side edge of the island to the end portions of the inner leads.

Consequently, when a plurality of lead frames are stacked, the maximum displacement between two stacked upper and lower lead frames in a direction parallel to the direction in which the inner leads extend is decreased to the distance Wb or less. This prevents the island of the upper lead frame from entering between the inner leads and the island of the lower lead frame.

In the first embodiment, therefore, the topmost one of a plurality of stacked leads frames can be easily pulled up and separated from the other lead frames without deforming or damaging the other lead frames.

Second Embodiment

Figure 3A:
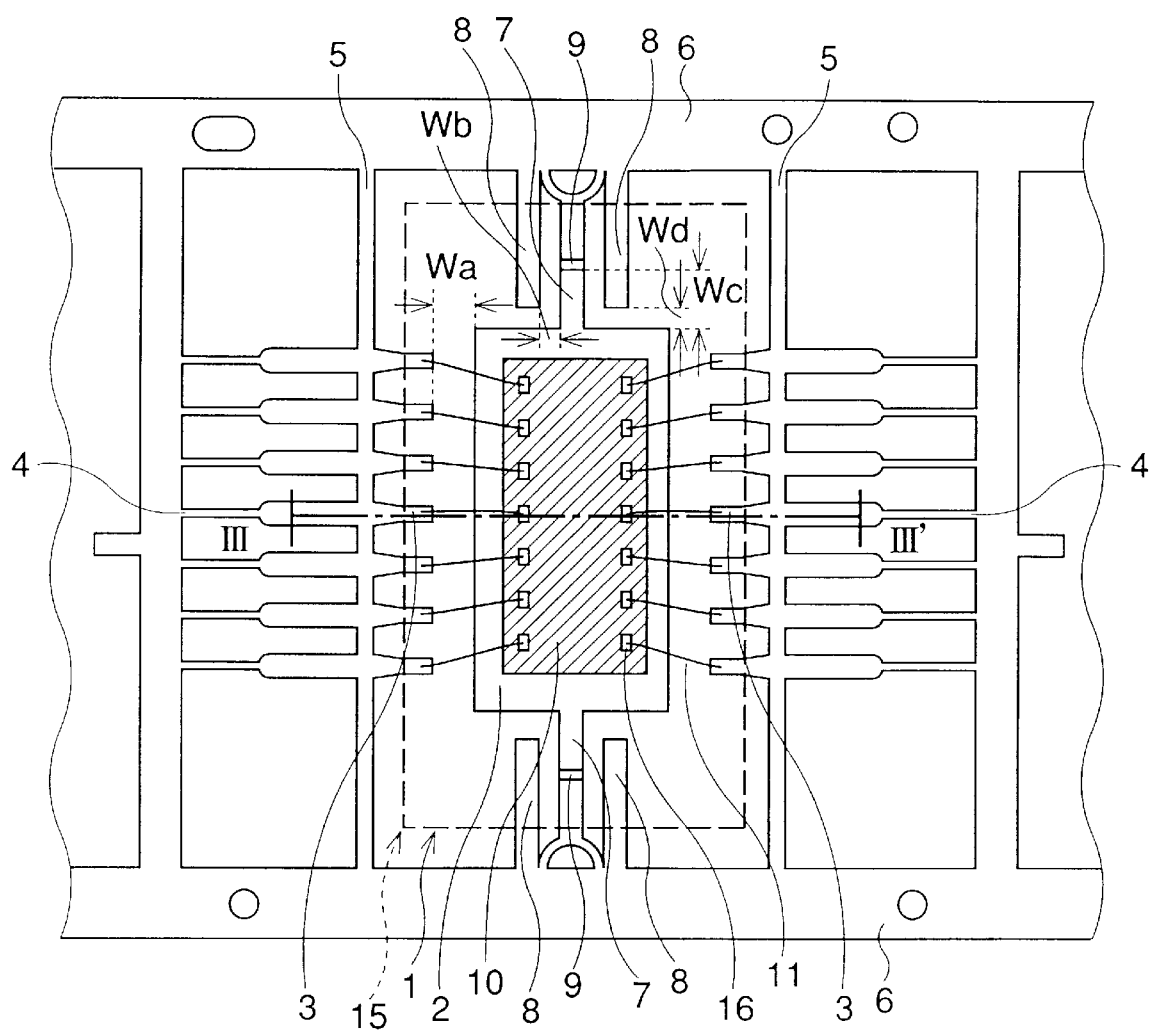
FIG. 3A is a schematic plan view showing a semiconductor device of the present invention before resin encapsulation.
Figure 3B:
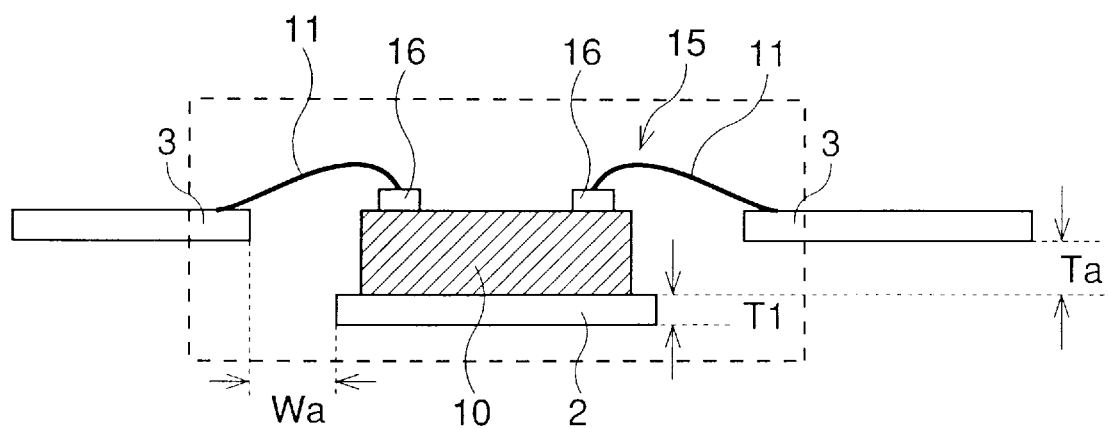
FIG. 3B is a schematic sectional view taken along a line III–III' in the semiconductor device shown in FIG. 3A.

The second embodiment will be described below. An outline of the arrangement of a lead frame used in a semiconductor device of this embodiment is entirely the same as that of the first embodiment, so a detailed description thereof will be omitted. Also, the same reference numerals as in the first embodiment denote the same parts of the lead frame of the second embodiment. FIG. 3A is a schematic plan view showing the state of the semiconductor device of the second embodiment before resin encapsulation. FIG. 3B is a sectional view taken along a line III–III' in FIG. 3A.

In the semiconductor device of the second embodiment shown in FIGS. 3A and 3B, a semiconductor chip 10 is mounted on an island 2 of the lead frame. Chip electrodes 16 formed on the surface of the semiconductor chip 10 and predetermined positions of inner leads 3 are electrically connected by conductive bonding wires 11. Dummy leads 8 are not connected to the bonding wires 11; the semiconductor chip 10 and the dummy leads 8 are electrically insulated from each other.

Figure 4:
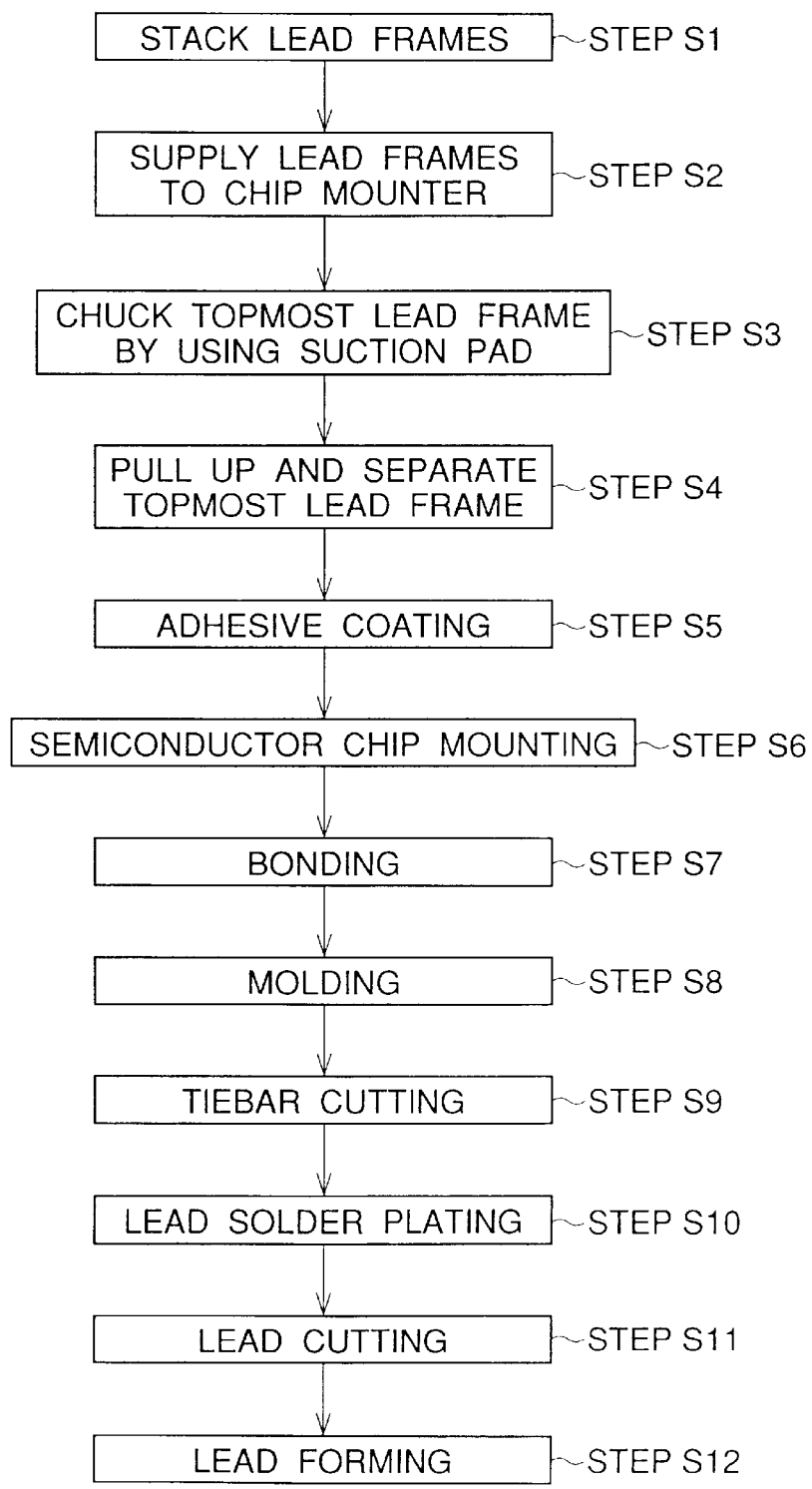
FIG. 4 is a flow chart showing a process of fabricating the semiconductor device o f the present invention in order of the steps.

FIG. 4 shows a process of fabricating the semiconductor device of this embodiment. In this embodiment, steps (steps S1 to S6) until the semiconductor chip 10 is mounted on the lead frame are similar to steps S21 to S26 of the conventional method using an automatic semiconductor chip mounter shown in FIG. 8. Therefore, adescription of these steps will be omitted. Steps from step S7 will be described below in order. After the semiconductor chip 10 is mounted on the island 2, the chip electrodes 16 formed on the surface of the chip 10 and the predetermined positions of the inner leads 3 are electrically connected by the bonding wires 11 (step S7). A characteristic feature of this embodiment is that the chip electrodes 14 and the dummy leads 8 are not connected. Next, a resin encapsulating region 15 is filled with a resin to encapsulate and mold the semiconductor chip 10 and the bonding wires 11 by transfer molding (step S8). Tiebars 5 of the lead frame are cut to electrically isolate outer leads 4 (step S9).

Figure 3C:
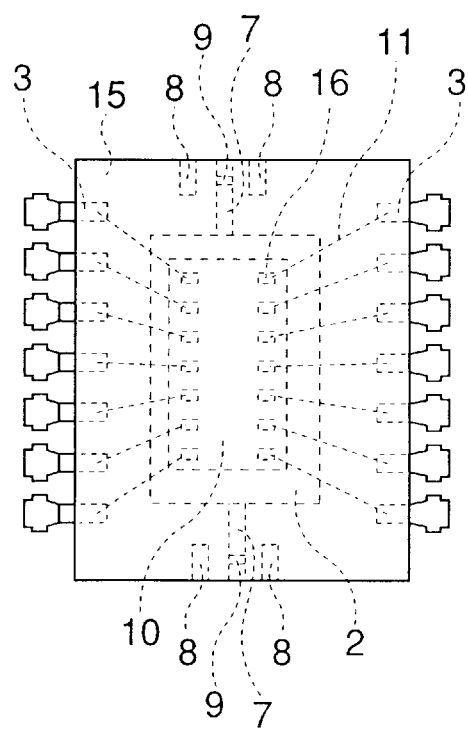
FIG. 3C is a schematic plan view of the semiconductor device of the present invention.

After the outer leads 4 are plated with solder for adhesion to a printed board (step S10), the outer leads 4, suspension pins 7, and the dummy leads 8 are cut from a base 6 (step S11). Finally, the outer leads 4 are bent through about 90° toward the lower surface of the package in order to mount the chip on a printed board, thereby completing the fabrication of the semiconductor chip of the second embodiment shown in FIG. 3C (step S12).

In this embodiment, even if vibrations or the like act on a plurality of stacked lead frames between steps S1 and S4 and two given stacked lead frames are displaced from each other in a direction parallel to the direction in which the inner leads 3 extend toward the island 2, as shown in FIG. 3A, the bent portion 9 of the suspension pin 7 of the upper lead frame comes in contact with the dummy lead 18 of the lower lead frame to prevent further displacement. That is, the displacement between two stacked lead frames is always decreased to a distance Wb or less.

In the second embodiment as described above, in a lead frame for mounting a semiconductor chip, dummy leads extending parallel to the side edges of the suspension pin are formed on the both sides of a suspension pin. Also, the end portions of these dummy leads protrude toward an island farther than a bent portion formed in the suspension pin. The distance Wb from the side edge of the suspension pin to the side edge of the adjacent dummy lead is made smaller than a minimum distance Wa from the side edge of the island to the end portions of the inner leads.

Consequently, when a plurality of lead frames are stacked, the maximum displacement between two stacked upper and lower lead frames in a direction parallel to the direction in which the inner leads extend is decreased to the distance Wb or less. This prevents the island of the upper lead frame from entering between the inner leads and the island of the lower lead frame.

In the second embodiment, therefore, the topmost one of a plurality of stacked leads frames can be easily pulled up and separated from the other lead frames without deforming or damaging the other lead frames. This improves the yield and productivity of semiconductor devices using this lead frame.

Third Embodiment

Figure 5A:
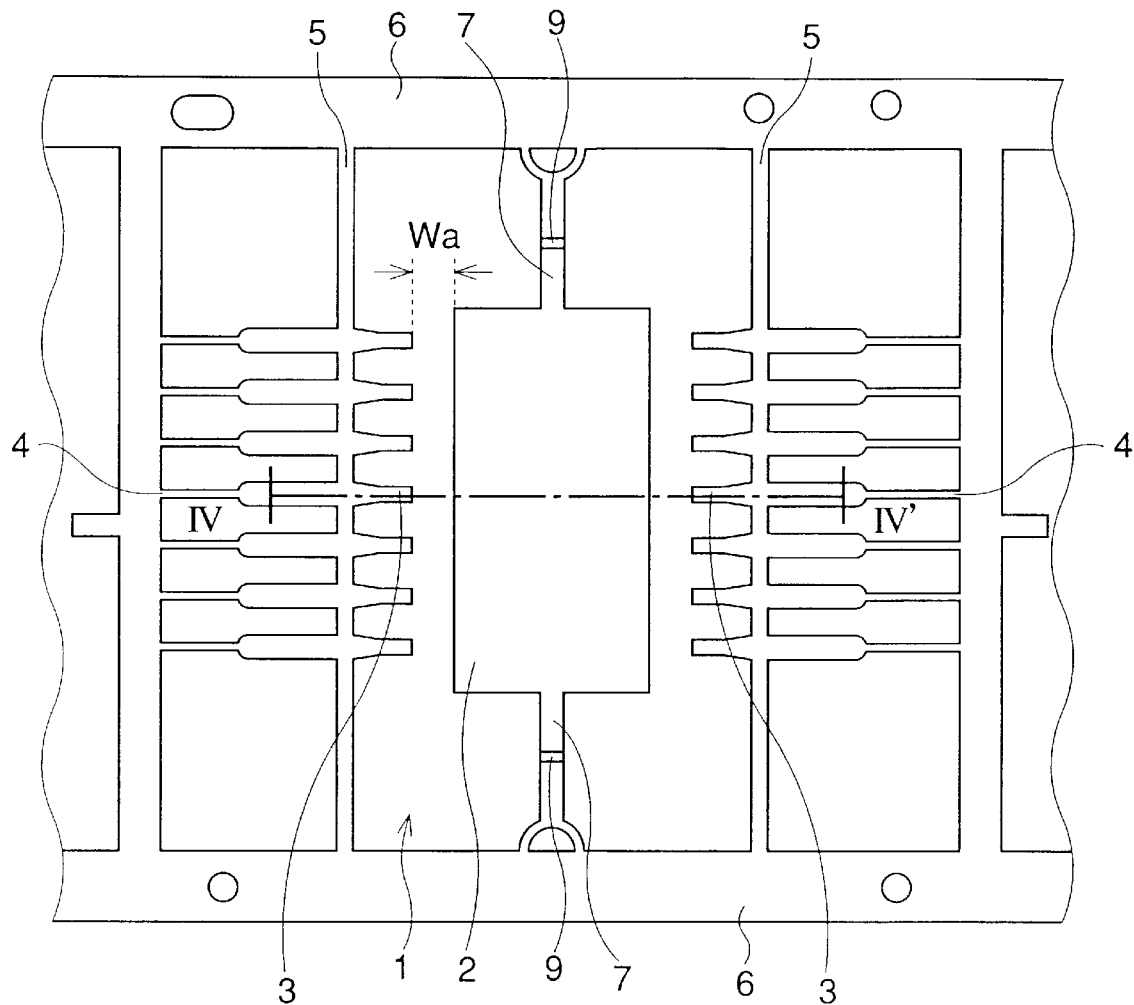
FIG. 5A is a schematic plan view showing a lead frame of the present invention.
Figure 5B:
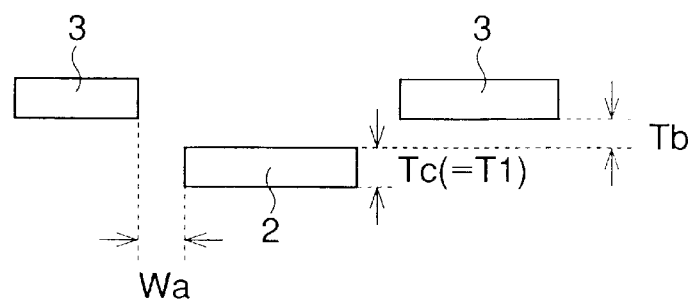
FIG. 5B is a schematic sectional view taken along a line IV–IV' in the lead frame shown in FIG. 5A.
Figure 6A:
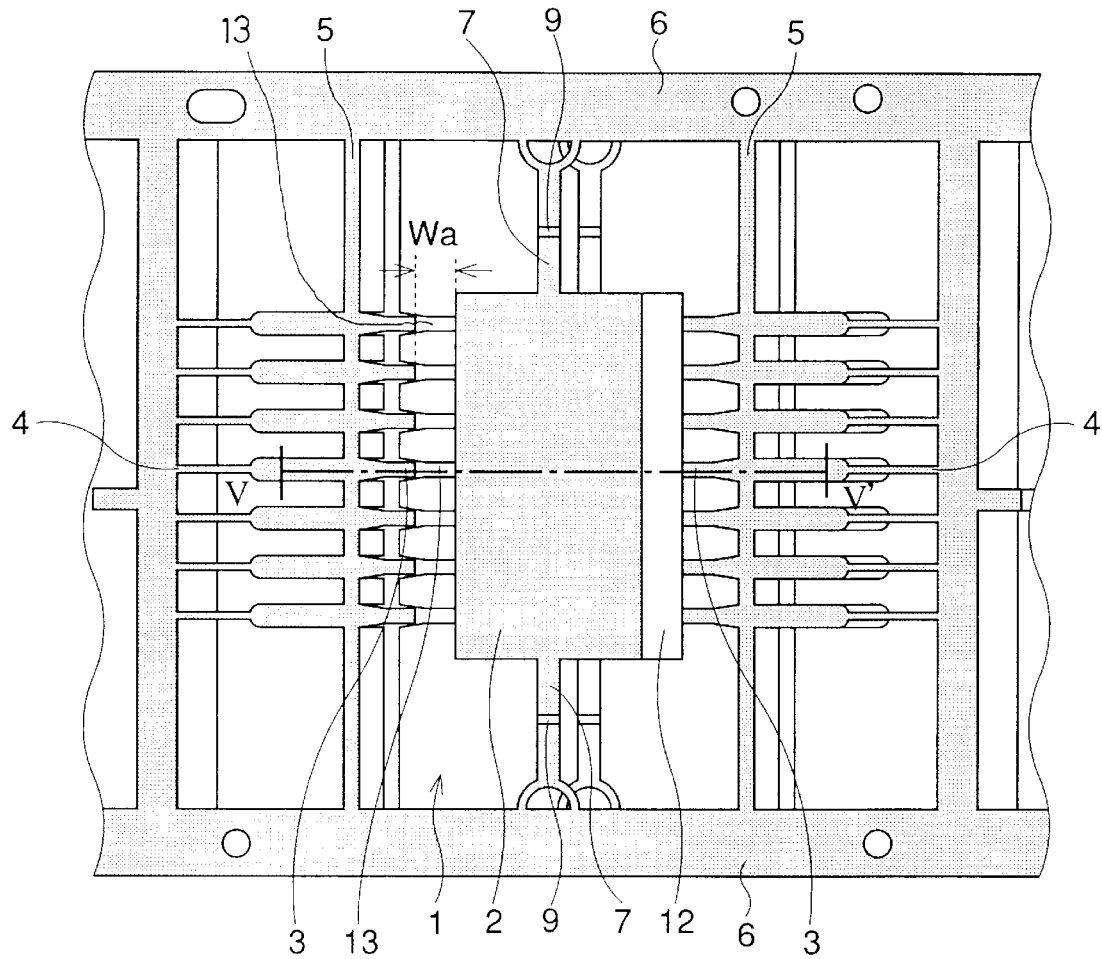
FIG. 6A is a schematic plan view showing the state wherein two lead frames of the present invention are stacked.
Figure 6B:
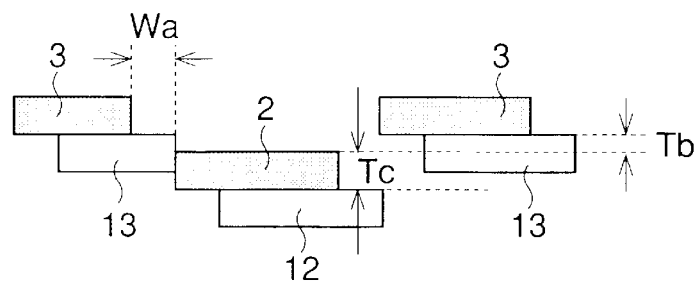
FIG. 6B is a schematic sectional view taken along a line V–V' in the lead frames shown in FIG. 6A.
Figure 7A:
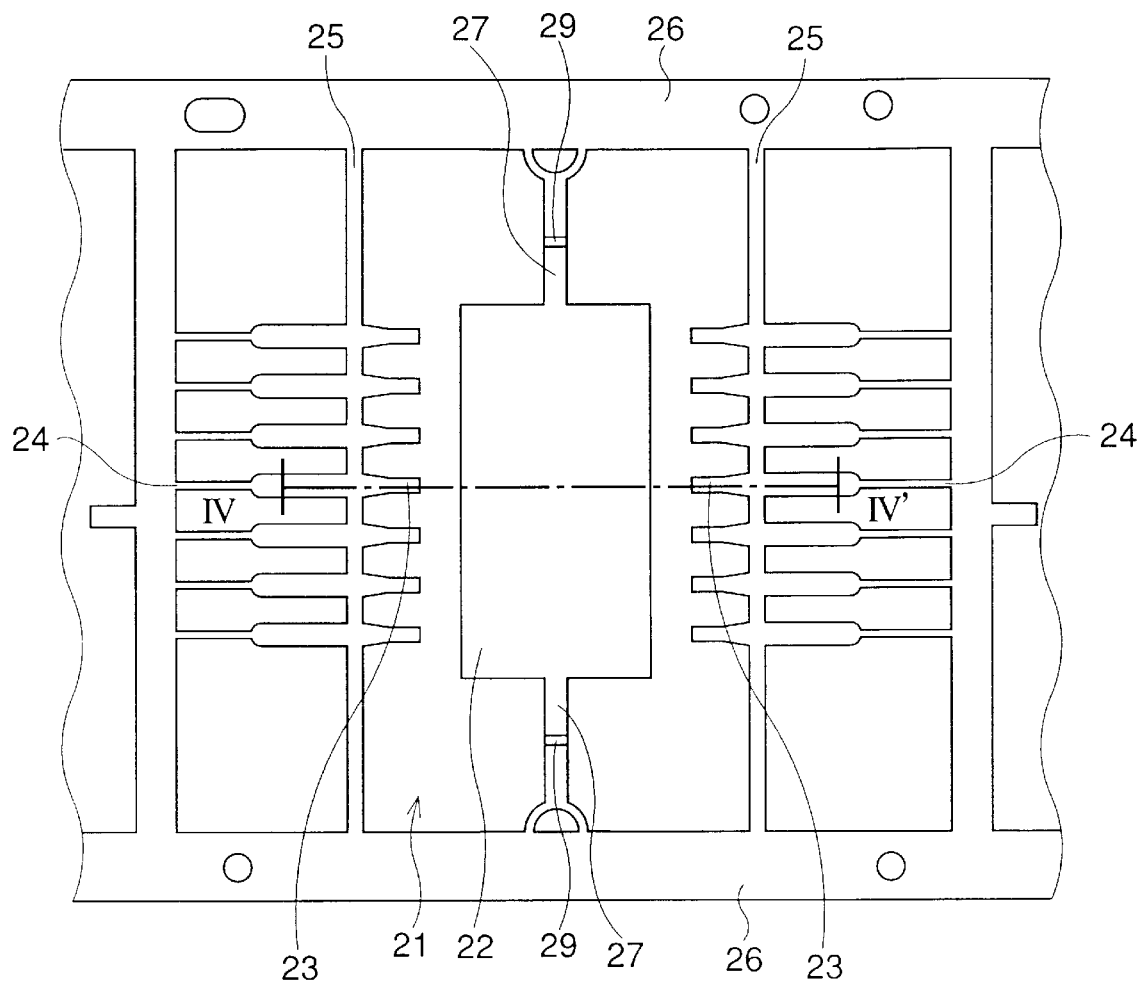
FIG. 7A is a schematic plan view showing a conventional lead frame.
Figure 7B:
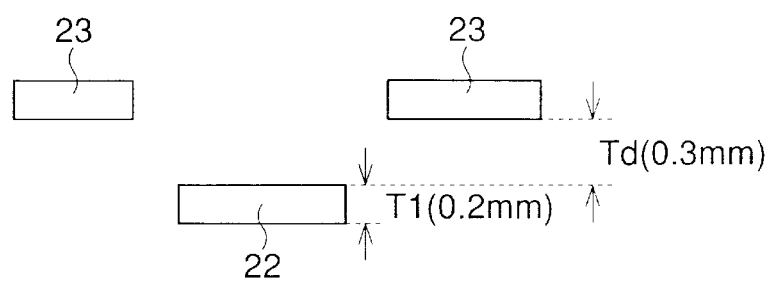
FIG. 7B is a schematic sectional view taken along a line VI–VI' in the lead frame shown in FIG. 7A.

The third embodiment will be described below. An outline of the arrangement of this lead frame is nearly the same as that of the first embodiment except that no dummy lead 8 is formed and the offset of an island 2 from a base 6 is different. FIG. 5A is a schematic plan view showing the lead frame according to the third embodiment of the present invention. FIG. 5B is a sectional view taken along a line IV–IV' in FIG. 5A. FIG. 6A is a schematic plan view showing the state wherein two stacked lead frames shown in FIG. 5A are maximally displaced from each other in a direction parallel to a direction in which inner leads extend toward an island. FIG. 6B is a sectional view taken along a line V–V' in FIG. 6A.

The same reference numerals as in the lead frame of the first embodiment denote the same parts in the lead frame of the third embodiment. A substantially rectangular device hole 1 is formed in a central portion of the lead frame of the third embodiment shown in FIG. 5A. In this device hole 1, a flat, substantially rectangular island 2, inner leads 3, outer leads 4, tiebars 5, and a pair of suspension pins 7 are formed. The inner leads 3 align at predetermined pitches toward a pair of opposing edges of the island 2. The outer leads 4 are connected in a one-to-one correspondence with the inner leads 3. Each tiebar 5 is so formed as to cross the boundary between the inner leads 3 and the outer leads 4. The suspension pins 7 connect those two edges of the island 2 which do not oppose the end portions of the inner leads 3 and a base 6.

Note that a plurality of such lead frames are continuously formed so that a plurality of semiconductor chips can be mounted. FIG. 5A shows one of these lead frames corresponding to one semiconductor chip. Note also that a thickness T1 of the lead frame is usually about 0.2 mm, although it also depends upon the type of product.

As shown in FIG. 5B, the island 2 is offset a predetermined distance Tb from the base 6 by a bent portion 9 formed in each suspension pin 7. This offset Tb is made smaller than at least a thickness Tc of the island 2. In this embodiment, the thickness of the lead frame is uniform, and Tc is equal to T1.

A process until a semiconductor chip is mounted on the island 2 of the lead frame of this embodiment is omitted because the process is similar to the conventional method using an automatic semiconductor chip mounter as shown in FIG. 8. In this embodiment, however, even if vibrations or the like act on a plurality of stacked lead frames between steps S21 and S24 of FIG. 8 and two given stacked lead frames are displaced from each other in a direction parallel to the direction in which the inner leads 3 extend, as shown in FIG. 6A, the side edge of the island 2 of the upper lead frame comes in contact with the end portions of inner leads 13 of the lower lead frame to prevent further displacement.

That is, the offset Tb of the island 2 from the base 6, i.e., the distance from the lower surface of the inner lead 3 to the upper surface of the island 2 in a direction perpendicular to the surface of the island 2 on which a chip is mounted is made smaller than the thickness Tc of the island 2. Therefore, as shown in FIGS. 6A and 6B, the side edge of the island 2 of the upper lead frame doesn't protrude toward the outer leads 4 farther than the end portions of the inner leads 3 of the lower lead frame. This prevents the island 2 of the upper lead frame from being clamped between the inner leads 3 and the island 2 of the lower lead frame.

In the third embodiment as described above, in a lead frame for mounting a semiconductor chip, the offset Tb of the island from the base is made smaller than the thickness Tc of the island.

Consequently, even if two stacked upper and lower lead frames are displaced from each other when a plurality of lead frames are stacked, the island of the upper lead frame is prevented from being clamped between the inner leads and the island of the lower lead frame.

In the third embodiment, therefore, the topmost one of a plurality of stacked leads frames can be easily pulled up and separated from the other lead frames without deforming or damaging the other lead frames.

What is claimed is:

1. A lead frame including a base, a substantially rectangular device hole formed in the base, and an island for mounting a semiconductor chip inside the device hole, comprising:

(a) an island having a rectangular shape, offset a predetermined distance in a direction of thickness from said base, and connected to said base by suspension pins;

(b) a plurality of inner leads arranged at predetermined intervals and having end portions extending toward said island; and (c) dummy leads extended from said base toward said island formed on both sides of said suspension pin, wherein (d) a distance from a side edge of said suspension pin to a side edge of said dummy lead is not longer than a distance from the end portions of said inner leads to a side edge of said island.

2. A lead frame according to claim 1, wherein
(a) two opposing edges of said island oppose the end portions of said inner leads, and
(b) said suspension pin is connected to that edge of said island, which does not oppose the end portions of said inner leads.

3. A lead frame according to claim 2, wherein
(a) a bent portion is formed in a predetermined position of said suspension pin to divide said suspension pin into a first portion formed on that side of said bent portion, which is closer to said island in substantially the same plane as a surface of said island, and a second portion formed on that side of said bent portion, which is closer to said base in substantially the same plane as said base, and
(b) a length of said dummy lead is longer than a length of said second portion of said suspension pin arranged adjacent to said dummy lead.

4. A lead frame according to claim 2, wherein
(a) a bent portion is formed in a predetermined position of said suspension pin to divide said suspension pin into a first portion formed on that side of said bent portion, which is closer to said island in substantially the same plane as a surface of said island, and a second portion formed on that side of said bent portion, which is closer to said base in substantially the same plane as said base, and
(b) said dummy lead protrudes toward said island farther than a boundary between said bent portion and said second portion of said suspension pin arranged adjacent to said dummy lead.

5. A lead frame according to claim 3, wherein said bent portion extends in a direction of thickness of said island from said first portion to said second portion.

6. A lead frame according to claim 3, wherein said bent portion extends in a direction in which a taper is formed from said first portion to said second portion.

7. A lead frame including a base, a substantially rectangular device hole formed in the base, and an island for mounting a semiconductor chip inside the device hole, comprising:
(a) an island having a rectangular shape, offset from said base by an amount smaller than a thickness of said island in a direction of thickness of said island, and connected to said base by suspension pins; and
(b) a plurality of inner leads arranged at predetermined intervals to extend toward said island.

8. A lead frame including a base, a substantially rectangular device hole formed in the base, and an island for mounting a semiconductor chip inside the device hole, comprising:
(a) an island having a rectangular shape, offset a predetermined distance in a direction of thickness of said island from said base, and connected to said base by suspension pins; and
(b) a plurality of inner leads arranged at predetermined intervals to extend toward said island,
wherein (c) a distance from lower surfaces of end portions of said inner leads to a plane extending from a chip mounting surface of said island is not longer than a thickness of said island.

9. A semiconductor device in which a semiconductor chip is mounted on one surface of an island formed in a lead frame, comprising:
(a) an island having a rectangular shape;
(b) a plurality of inner leads arranged at predetermined intervals, having end portions extending toward said island, and offset a predetermined distance from said island;
(c) a suspension pin connected to a side edge of said island to extend in a direction perpendicular to a direction of thickness of said island; and
(d) dummy leads formed on both sides of said suspension pin and having end portions extending toward said island,
wherein (e) a distance from a side edge of said suspension pin to a side edge of said dummy lead is not longer than a distance from the end portions of said inner leads to a side edge of said island.

10. A lead frame according to claim 9, wherein
(a) two edges of said island opposing each other oppose the end portions of said inner leads, and
(b) said suspension pin is connected to that edge of said island, which does not oppose the end portions of said inner leads.

11. A semiconductor device according to claim 10, wherein
(a) said inner leads are connected to chip electrodes formed on said semiconductor chip by bonding wires, and
(b) said dummy leads are not connected to said chip electrodes of said semiconductor chip by said bonding wires.

12. A semiconductor device according to claim 11, wherein
(a) a bent portion is formed in a predetermined position of said suspension pin to divide said suspension pin into a first portion formed on that side of said bent portion, which is closer to said island in substantially the same plane as a surface of said island, and a second portion formed on that side of said bent portion, which is closer to said base in substantially the same plane as said base, and
(b) a length of said dummy lead is longer than a length of said second portion of said suspension pin located adjacent to said dummy lead.

13. A semiconductor device according to claim 11, wherein
(a) a bent portion is formed in a predetermined position of said suspension pin to divide said suspension pin into a first portion formed on that side of said bent portion, which is closer to said island in substantially the same plane as a surface of said island, and a second portion formed on that side of said bent portion, which is closer to said base in substantially the same plane as said base, and
(b) said dummy lead protrudes toward said island farther than a boundary between said bent portion and said second portion.

14. A semiconductor device according to claim 13, wherein said bent portion extends in a direction of thickness of said island from said first portion to said second portion.

15. A semiconductor device according to claim 13, wherein said bent portion extends in a direction in which a taper is formed from said first portion to said second portion.

16. A semiconductor device in which a semiconductor chip is mounted on one surface of an island of a lead frame, comprising:

(a) an island having a rectangular shape;

(b) a plurality of inner leads arranged at predetermined intervals to extend toward said island, connected to chip electrodes formed on a surface of said semiconductor chip by bonding wires, and offset from said island by an amount smaller than a thickness of said island in a direction of thickness of said island;

(c) a suspension pin having a bent portion in a predetermined position and connected to a side edge of said island to extend in a direction perpendicular to the direction of thickness of said island.

17. A semiconductor device in which a semiconductor chip is mounted on one surface of an island of a lead frame, comprising:

(a) an island having a rectangular shape;

(b) a plurality of inner leads arranged at predetermined intervals to extend toward said island, connected to chip electrodes formed on a surface of said semiconductor chip by bonding wires, and offset from said island in a direction of thickness of said island, (c) a distance from a lower surface of an end portion of said inner lead to a plane extending from a chip mounting surface of said island being not longer than the thickness of said island; and (d) a suspension pin having a bent portion in a predetermined position and connected to a side edge of said island to extend in a direction perpendicular to the direction of thickness of said island.

* * * * *